United States Patent [19]

Tokunaga et al.

[11] Patent Number: 5,214,284
[45] Date of Patent: May 25, 1993

[54] METHOD AND ARRANGEMENT FOR TESTING AND REPAIRING AN INTEGRATED CIRCUIT

[75] Inventors: Yasuo Tokunaga, Schwaben; Jurgen Frosien, Ottobrunn, both of Fed. Rep. of Germany

[73] Assignee: ICT Integrated Circuit Testing Gesellschaft fur Halbleiterpruftechnik mbH, Fed. Rep. of Germany

[21] Appl. No.: 744,933

[22] Filed: Aug. 14, 1991

[30] Foreign Application Priority Data

Aug. 27, 1990 [DE] Fed. Rep. of Germany ....... 4027062

[51] Int. Cl.⁵ ..................... H01J 37/26; H01J 37/302
[52] U.S. Cl. .................................. 250/309; 250/310; 250/492.21
[58] Field of Search ........... 250/309, 310, 398, 492.21, 250/492.2

[56]  References Cited

U.S. PATENT DOCUMENTS

| | | | |
|---|---|---|---|
| 4,683,376 | 7/1987 | Feuerbaum et al. | 250/309 |
| 4,812,651 | 3/1989 | Feuerbaum | 250/310 |
| 4,827,127 | 5/1989 | Todokoro | 250/310 |
| 4,908,226 | 3/1990 | Kubena et al. | 250/492.21 |
| 4,983,830 | 1/1991 | Iwasaki | 250/310 |
| 5,061,856 | 10/1991 | Frosien et al. | 250/310 |
| 5,083,033 | 1/1992 | Komane et al. | 250/492.2 |

*Primary Examiner*—Bruce C. Anderson
*Attorney, Agent, or Firm*—Learman & McCulloch

[57] ABSTRACT

The invention relates to an arrangement for testing and repairing an integrated circuit in which the ion beam used for the repair simultaneously forms the corpuscular beam used for the test operation and one single beam generator is provided in order to generate this beam. Testing and repairing in one arrangement, without it being necessary to transfer the integrated circuit to be examined, reduces the expenditure in terms of time and cost.

5 Claims, 4 Drawing Sheets

METHOD AND ARRANGEMENT FOR TESTING AND REPAIRING AN INTEGRATED CIRCUIT

TECHNICAL FIELD

The invention relates to a method and to an arrangement for testing and repairing an integrated circuit.

BACKGROUND OF THE INVENTION

It is known to use an electron beam device for testing integrated circuits. In this case the integrated circuit to which an input signal is applied is scanned with an electron beam. The secondary electrons generated at a specific measuring point are converted into a corresponding electrical actual-value signal and compared with the theoretical-value signal determined by the input signal. The repair of an integrated circuit which is recognised as defective is then undertaken in an ion beam device.

However, the consequence of the transfer of the integrated circuit from the electron beam device to the ion beam device is that the defective point in the integrated circuit must be located again before the actual repair with the ion beam can be undertaken. Subsequent checking of the repair must be carried out again in an electron beam device.

Apart from the great expenditure of time, many expensive devices are necessary for such a test and repair process.

The object of the invention is to make further developments in such a way that the expenditure in terms of time and cost associated with the testing and repair of an integrated circuit is substantially reduced by comparison with the prior art.

SUMMARY OF THE INVENTION

This object is achieved according to the invention in that the ion beam used for the repair simultaneously forms the corpuscular beam used for the test opening and one single beam generator is provided for generation of this beam.

This eliminates the time-consuming transfer of the integrated circuit between a device for testing and a device for repairing. Since the ion beam which is generated is used both for testing and for repairing the integrated circuit, one single beam generator is sufficient so that the cost is significantly reduced.

THE DRAWINGS

Further features of the invention are the subject matter of the subordinate claims and are explained in greater detail in the drawings and the following description.

THE PREFERRED EMBODIMENT

Figure 1:
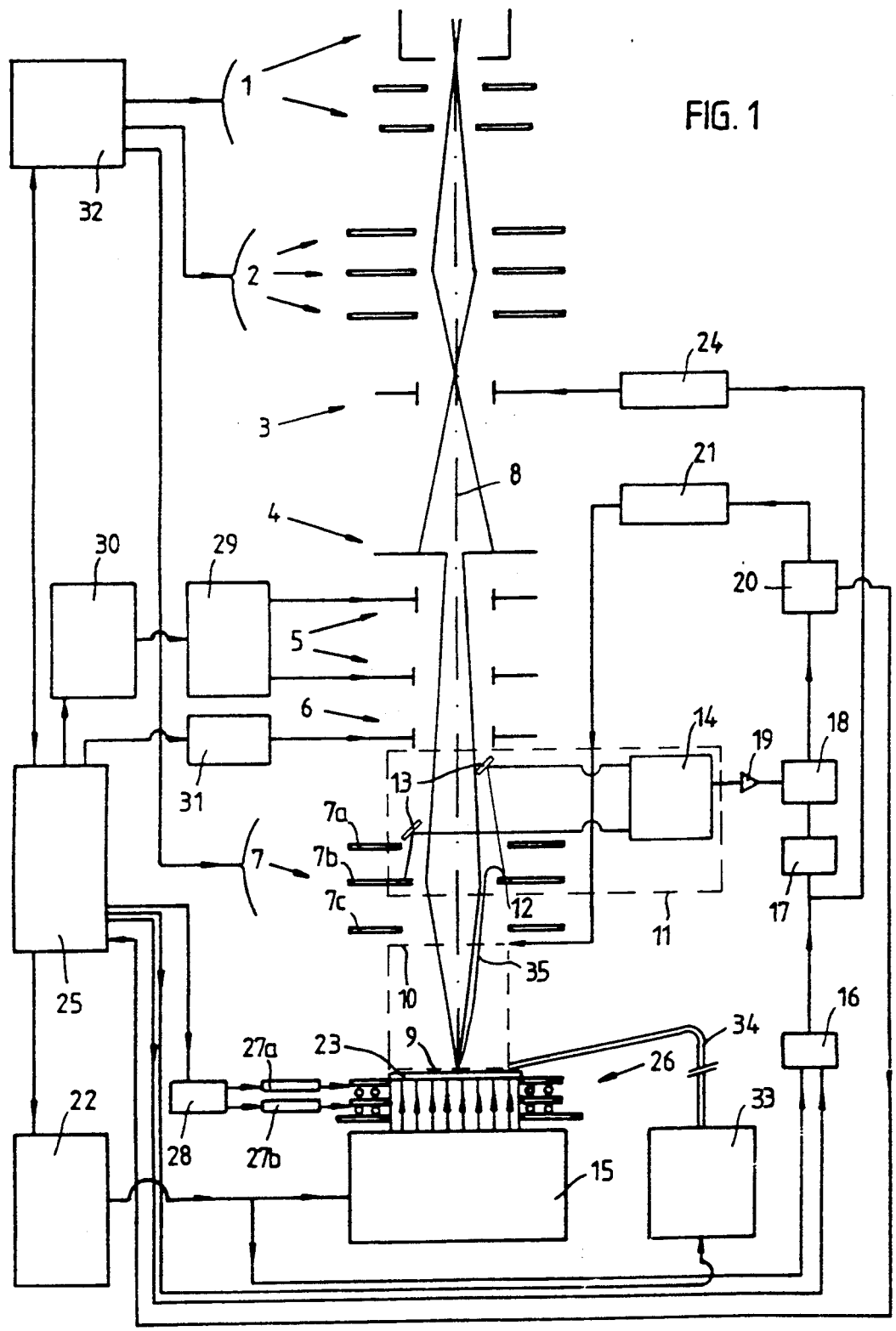
FIG. 1 shows a schematic representation of a first embodiment.

The embodiment of an arrangement for testing and repairing an integrated circuit which is illustrated in FIG. 1 contains an ion source 1, a condenser lens 2, a blanking system 3, an aperture diaphragm 4, a deflector 5, a stigmator 6 and an objective lens 7. The objective lens 7 contains three rotationally symmetrical electrodes 7a, 7b, 7c which are arranged behind one another in the beam direction, and the axis 8 of the ion beam coincides with the axis of the objective lens 7.

A secondary electron spectrometer is also integrated into this arrangement, and essentially contains an extraction electrode 9, a filter electrode 10, a secondary electron detector 11 and a control circuit (which will be explained in greater detail below).

The secondary electron detector 11 consists essentially of a scintillator 12, which is formed by the inner region of the central electrode 7b of the objective lens 7, and of a mirror 13 (or some other optical system) as well as a multiplier 14. Instead of this the scintillator 12 can also be connected to the multiplier 14 by a photoconductor.

The arrangement for applying an input signal to an integrated circuit 23 is formed by a LSI tester 22 which is connected to the integrated circuit 23 by a test head 15.

The control circuit which connects the scintillator 12 to the filter electrode 10 contains the LSI tester 22 with test head 15, a phase control 16, a retarder 17, a pre-amplifier 19, a signal-processing circuit 20 and an amplifier 21 the output of which is connected to the filter electrode 10.

The output of the phase control 16 which is connected to the retarder 17 is also connected to the blanking system 3 by a pulse generator 24.

A data-processor 25 controls the LSI tester 22 as well as the phase control 16. A corresponding return signal is passed to the data processor 25 from the signal-processing circuit 20.

The integrated circuit 23 to be examined is located on a table 26 which is movable as required in the vertical direction with respect to the axis of the objective lens 7. This movement is achieved by means of two motors 27a, 27b which are controlled by the data processor 25 via a control unit 28.

In order to actuate the deflector 5 a driver 29 is provided which is driven by the data processor 25 via a control 30. The stigmator 6 is also connected to the data processor 25 by a control 31. A further control 32 which is connected to the data processor 25 controls the ion source 1, the condenser lens 2 and the objective lens 7.

A depositing device 33 with a nozzle 34 is provided for deposition of conductive material on the integrated circuit 23, and is also controlled via the data processor 25.

The arrangement according to FIG. 1 provides on the one hand a device for testing and on the other hand a device for repairing an integrated circuit. First of all the way in which it functions during the test operation will be described:

Depending upon the potential at this point, the ion beam focused onto the integrated circuit 23 generates a corresponding number of secondary electrons 35.

The general principle of the control circuit consists of controlling the secondary electron signal at a constant current and at the same time generating the phase control for the blanking system 3 of the ion beam.

The secondary electrons 35 generated by the ion beam when it strikes the specimen 23 must first of all pass through the filter electrode 10 after passing through the extraction electrode 9. Since the filter electrode lies at a specific negative potential (which is controlled by the control circuit, as will be explained below), only the secondary electrons which have a sufficiently high energy level are allowed to pass through the filter electrode 10.

When the potential at the examined measuring point of the integrated circuit 23 alters, the energy distribution of the secondary electrons is shifted and correspondingly more or fewer electrons reach the scintillator 12 of the secondary electron detector 11. The potential of the filter electrode 10 is adjusted so that the stream of secondary electrons remains constant. Thus the potential of the filter electrode 10 is altered as a function of the potential to be measured on the integrated circuit 23. In this way the changing potential of the filter electrode 10 represents a criterion for the potential to be measured on the integrated circuit 23.

In detail, the outer control circuit operates as follows: the secondary electron detector 11 converts the secondary electrons generated by the ion beam at the measurement point—in so far as they pass through the filter electrode 10—into an electrical actual-value signal which, after amplification in the pre-amplifier 19, is scanned by the gate 18. This scanning is controlled by the LSI tester 22 which also simultaneously drives the integrated circuit 23 to be examined by means of the test head 15. In this case the phase control 16 makes it possible to set the scanning time.

The ion beam blanking system 3 is controlled by the output of the phase control 16 via the pulse generator 24. The retarder 17 is provided in order to take account of the duration of the ion beam from the blanking system 3 to the integrated circuit 23.

The arrangement for comparing the converted actual-value signal with the theoretical-value signal is formed by the signal-processing circuit 20. The output signal of the pre-amplifier 19 which is scanned by the gate 18 is averaged in the signal-processing circuit 20 in order to improve the signal/noise ratio. By means of a comparator a comparison is made with the theoretical-value signal which corresponds to the desired constant stream of secondary electrons. The output signal passes via the amplifier 21 to the filter electrode 10 and keeps the stream of secondary electrons constant in the manner already explained by altering the negative potential of the filter electrode 10, even when the potential to be measured at the examined measurement point of the integrated circuit 23 changes.

Naturally, instead of a blanking system 3 for blanking the ion beam, a pulsed ion source can also be used within the scope of the invention.

The ion beam can be adjusted by moving the table 26 by means of the motors 27a, 27b via the control unit 28 to any measurement point whatsoever on the integrated circuit 23. It is also possible to move the ion beam on the integrated circuit via the control 30 and the driver 29 of the deflector 5. The relative movement of the ion beam and the integrated circuit 23 can also be solved within the scope of the invention by for example moving the axis 8 of the ion beam and thus the entire apparatus at right angles to the integrated circuit 23.

By means of the test head 15 an input signal is applied to the integrated circuit 23 by the LSI tester 22, and the resulting output signal is in turn passed to the LSI tester 22 via the test head 15. In this way the information is produced as to whether there is a defect in the circuit. If there is a defect, various test programs are generated by the LSI tester 23 in order to locate the defect.

After this rough fault location specific measurements must be carried out in the interior of the circuit. Measurement points are established by means of a CAD system and the electrical description of the integrated circuit 23. The individual measurement points are struck by the ion beam in order to carry out potential measurements therein the manner described above.

At each measurement point the data processor 25 receives from the signal-processing circuit 20 information as to whether the actual-value signal deviates from the theoretical-value signal. These measurements are repeated at various measurement points until the defect is exactly located. In this case the choice of individual measurement points is advantageously guided by the results of the preceding measurements. This can be done either automatically by the data processor 25 or by the operator.

Various representations of the integrated circuit 23 to be examined can be displayed on a screen 36 of the data processor 25. FIGS. 4a to 4g show possible menus which can be combined in any manner on the screen 36.

Figure 4:
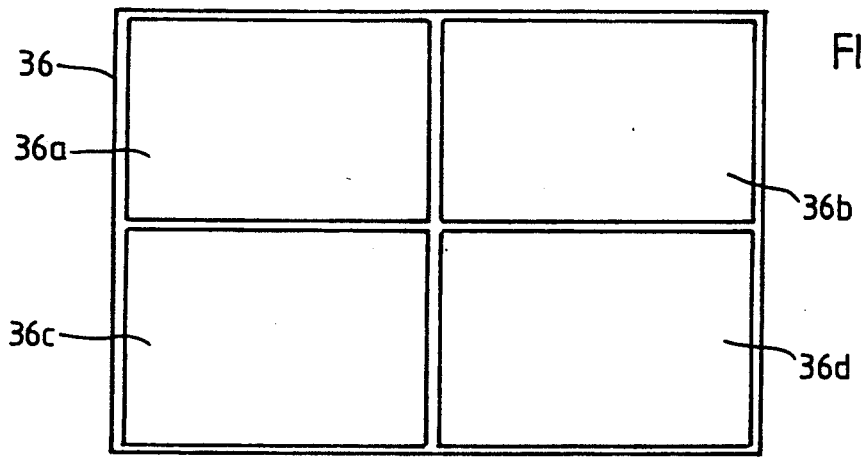
FIGS. 4, 4a to 4g show representations of menus on a display screen.
Figure 4A:
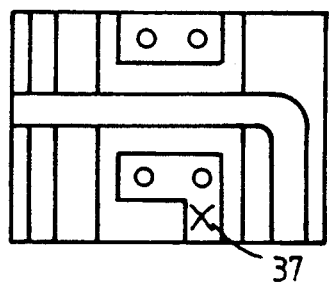
Figure 4E:
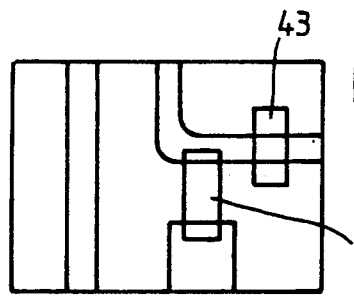

FIG. 4a shows a so-called SEM image of a section of the integrated circuit 23 which is produced by scanning of the integrated circuit with the ion beam. The measurement point which is just about to be examined is designated by the reference numeral 37.

Figure 4B:
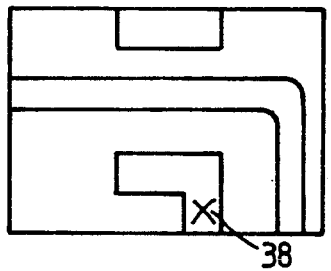

FIG. 4b shows over the whole section of the integrated circuit 23 the corresponding CAD layout, with the position 38 of the layout corresponding to the measurement point 37.

Figure 4F:
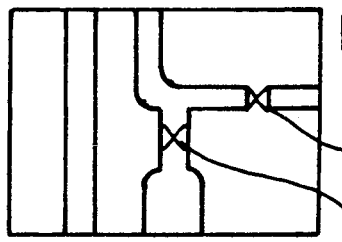
Figure 4C:
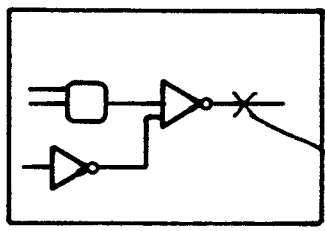
Figure 4G:
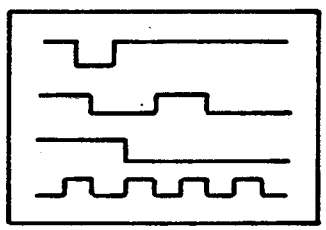

FIG. 4c shows a CAD block circuit diagram in which the measurement point 37 or the position 38 is designated by the corresponding position 39 in the block circuit diagram.

Figure 4D:
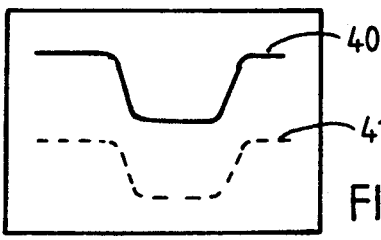

The wave form 41 corresponds to the wave form 40 in FIG. 4d, for example the wave form signal measured at the measurement point 37. The wave form 40 is produced by simulation, so that the operator can determine on the screen whether there are any deviations between the measured and simulated wave form.

If the defect is located unequivocally, the repair can be carried out immediately with the aid of the arrangement for testing and repairing an integrated circuit without the integrated circuit 23 having to be transferred. The device for repairing an integrated circuit which is provided in this arrangement also uses an ion beam. In this case the ion beam used for the repair simultaneously forms the ion beam used for the test operation. This beam is generated in one single beam generator, namely the ion source 1.

There are essentially two possibilities available for the repair of an integrated circuit. On the one hand conductive tracks can be severed by the ion beam and on the other hand conductive material can be applied to the integrated circuit by an depositing arrangement so that new conductive connections are produced.

It depends upon the individual case which of these two possibilities is used for elimination of a defect. FIG. 4f shows a CAD layout in which the points of the deposition 42 and the severance 43 are indicated. The newly produced conductive track 44 and the cut point 45 can be seen in FIG. 4g, again in a CAD layout.

The deposition operation is carried out by controlling the deposition arrangement 33 by means of the data processor 25, the outlet opening of the nozzle 34 being brought into the correct position by moving the table 26.

FIG. 4h shows a control menu in which the wave form signals produced by simulation and/or measurements can be put together.

The menus according to FIGS. 4a to 4g should be regarded merely as examples of arrangements and can be altered or expanded for special applications. The number of menus displayed simultaneously on the screen 36 is not in any way restricted to the number of four menus 36a to 36d shown in FIG. 4. On the contrary, depending upon the application it is possible to have only one menu or to combine any number of menus. The realisation of the device for testing and the device for repairing in one arrangement with the provision of only one single beam generator proves helpful particularly in the following respects:

a) the LSI tester 22 can apply an input signal to the integrated circuit 23 so that it can be confirmed immediately whether the measurement point struck corresponds exactly to the located defect point.

b) the LSI tester 22 can check rapidly and easily whether for example a conductive track has really been severed or whether the conductive which has been newly produced by deposited material has good and accurate contact with other conductive tracks.

The data processor 25 has available to it all the circuitry data of the integrated circuit 23, for example block circuit diagrams, layout and mask data. The new integrated circuit produced by a repair can in turn be stored in the data processor, and new simulations for this circuit can be carried out. In this way the time for development of a circuit can be markedly reduced.

Accordingly the arrangement for testing and repairing can be used not only for finished integrated circuits—which should merely be checked once—but can also be used for the circuit construction in the development phase. In this connection it is also conceivable within the scope of the invention to provide a further arrangement with the aid of which components such as for example resistors or transistors can be applied to the integrated circuit.

Figure 2:
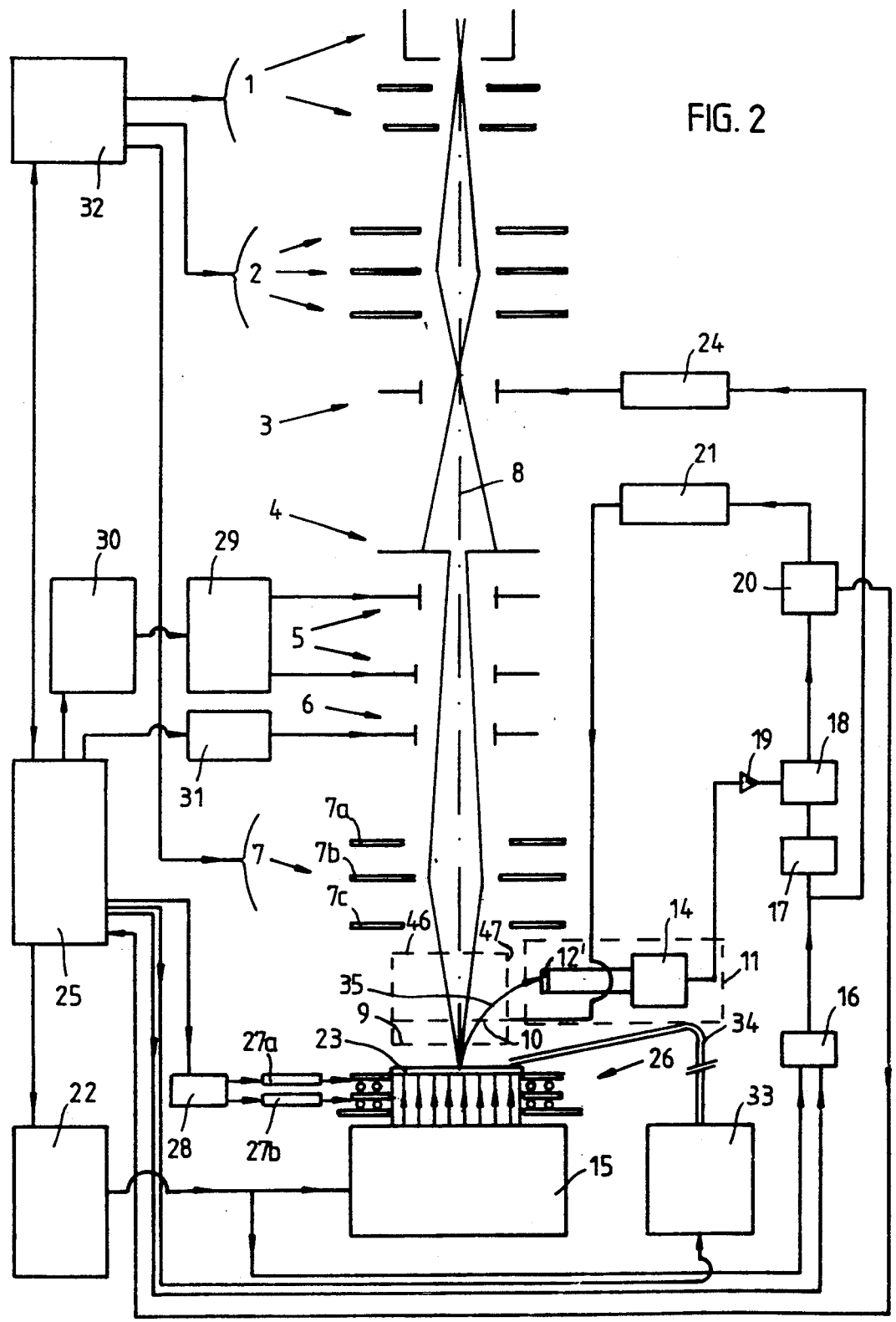
FIG. 2 shows a schematic representation of a second embodiment.

In the first embodiment according to FIG. 4 the scintillator 12 is formed by the central electrode 7b of the objective lens 7. In the embodiment according to FIG. 2 the scintillator 12' is arranged outside the objective lens 7.

Figure 3:
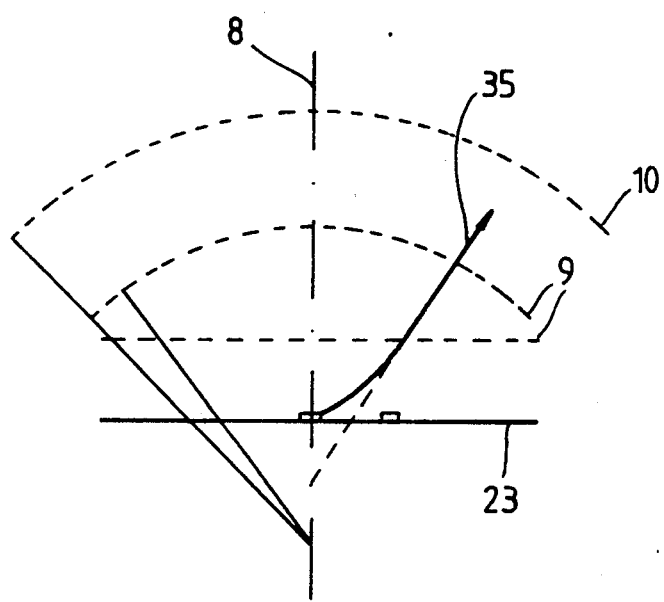
FIG. 3 shows a schematic representation of an embodiment of a secondary electron spectrometer.

The secondary electron spectrometer contains in addition to the extraction electrode 9 and the filter electrode 10 a pressure electrode 46 and a deflector electrode 47. The pressure electrode 46 and the deflector electrode 47 ensure that after the generated secondary electrons pass through the filter electrode 10 they reach the scintillator 12' which is arranged at the side adjacent to the secondary electron spectrometer. Otherwise the construction and the operation is analogous the embodiment according to FIG. 1. The extraction electrode 9 and the filter electrode 10 are shown in FIG. 10 as planar grids, but can also advantageously be constructed as spherical grids, as shown in FIG. 3.

We claim:

1. Apparatus for testing and repairing an integrated circuit comprising:
   a) a device for testing an integrated circuit having:
      a 1) an ion source for generating a test ion beam,
      a 2) means for deflecting the test ion beam;
      a 3) an electrostatic objective lens for focusing the test ion beam onto the integrated circuit and having three rotationally symmetrical electrodes arranged behind one another in the beam direction, the axis of the test ion beam coinciding with the axis of said objective lens,
      a 4) a tester for applying an input signal to the integrated circuit,
      a 5) a secondary electron spectrometer for conversion of the secondary electrons generated by the test ion beam at a measurement point into an electrical actual-value signal, said secondary electron spectrometer including an extraction electrode, a filter electrode, a control circuit and a secondary electron detector having a scintillator, said control circuit connecting said scintillator to said filter electrode, and
      a 6) a signal-processing circuit for comparing the converted actual-value signal with a theoretical-value signal determined by the input signal, and
   b) a device for repairing the integrated circuit which has been recognized as defective, comprising:
      b 1) an ion source for generating a repair ion beam,
      b 2) a data processor programmable with circuitry data of the integrated circuit, said data processor being able to control the repair ion beam and store the circuitry data for the new integrated circuit produced by the repair;
   c) the repair ion beam forming the test ion beam, one single beam generator being provided for generating the ion beam.

2. Apparatus as claimed in claim 1 further comprising a table for supporting the integrated circuit, said extraction electrode and said filter electrode being arranged between said table and said electrodes of the objective lens.

3. Apparatus as claimed in claim 1 wherein said tester and said control circuit are connected to said data processor.

4. Apparatus as claimed in claim 1 wherein said scintillator is formed by a central one of said electrodes of said objective lens.

5. Apparatus as claimed in claim 1 wherein said scintillator is located outside said objective lens.

* * * * *